United States Patent
Horio et al.

(10) Patent No.: US 10,868,230 B2
(45) Date of Patent: Dec. 15, 2020

(54) THERMOELECTRIC CONVERSION MODULE AND MANUFACTURING METHOD THEREOF

(71) Applicant: Yamaha Corporation, Hamamatsu (JP)

(72) Inventors: Yuma Horio, Hamamatsu (JP); Takahiro Hayashi, Hamamatsu (JP)

(73) Assignee: YAMAHA CORPORATION, Hamamatsu (JP)

( * ) Notice: Subject to any disclaimer, the term of this patent is extended or adjusted under 35 U.S.C. 154(b) by 195 days.

(21) Appl. No.: 15/252,955

(22) Filed: Aug. 31, 2016

(65) Prior Publication Data
US 2017/0069816 A1    Mar. 9, 2017

(30) Foreign Application Priority Data
Sep. 4, 2015  (JP) .................. 2015-174340

(51) Int. Cl.
| | | |
|---|---|---|
| *H01L 35/32* | (2006.01) | |
| *H01L 35/34* | (2006.01) | |
| *H01L 35/08* | (2006.01) | |
| *H01L 35/16* | (2006.01) | |
| *H01L 35/18* | (2006.01) | |

(52) U.S. Cl.
CPC .............. *H01L 35/32* (2013.01); *H01L 35/08* (2013.01); *H01L 35/16* (2013.01); *H01L 35/18* (2013.01); *H01L 35/34* (2013.01)

(58) Field of Classification Search
CPC ......... H01L 35/30; H01L 35/32; H01L 35/34; H01L 35/325
See application file for complete search history.

(56) References Cited

U.S. PATENT DOCUMENTS

| 9,601,679 B2 | 3/2017 | Tohei et al. |
| 9,705,061 B2 | 7/2017 | Hayashi |
| (Continued) | | |

FOREIGN PATENT DOCUMENTS

| JP | 2004273489 A | * | 9/2004 |
| JP | 2008028048 A |   | 2/2008 |
| (Continued) | | | |

OTHER PUBLICATIONS

English translation of JP 2004-273489 A provided via the EPO. (Year: 2018).*

(Continued)

*Primary Examiner* — Daniel P Malley, Jr.
(74) *Attorney, Agent, or Firm* — Rossi, Kimms & McDowell LLP (57) ABSTRACT

Provided is a thermoelectric conversion module having a high heat resistance. The thermoelectric conversion module includes a first substrate, a second substrate, a thermoelectric element, and a bonding layer. The first substrate includes a first metalized layer. The second substrate includes a second metalized layer which faces the first metalized layer. The thermoelectric element includes a chip formed from a thermoelectric material and is arranged between the first metalized layer and the second metalized layer. The bonding layer is composed of a sintered body of a metallic material of which the average crystal particle diameter is no greater than 20 μm and bonds the first metalized layer and the second metalized layer with the thermoelectric element.

8 Claims, 4 Drawing Sheets

(56) References Cited

U.S. PATENT DOCUMENTS

| | | | |
|---|---|---|---|
| 2008/0135082 A1 | 6/2008 | Hirono et al. | |
| 2009/0272417 A1* | 11/2009 | Schulz-Harder | H01L 35/08 136/203 |
| 2012/0160293 A1* | 6/2012 | Jinushi | H01L 35/08 136/237 |
| 2013/0139866 A1* | 6/2013 | Moczygemba | C23C 4/02 136/230 |
| 2013/0199025 A1 | 8/2013 | Platzek et al. | |
| 2013/0213447 A1 | 8/2013 | Hayashi | |
| 2013/0263906 A1* | 10/2013 | Maeshima | H01L 35/32 136/205 |
| 2014/0305482 A1 | 10/2014 | Tohei et al. | |
| 2015/0200345 A1 | 7/2015 | Morelli et al. | |
| 2016/0141479 A1* | 5/2016 | Matsunami | H01L 35/08 136/238 |
| 2016/0163951 A1* | 6/2016 | Tanaka | H01L 35/32 136/205 |
| 2018/0033938 A1* | 2/2018 | Lee | H01L 35/04 |

FOREIGN PATENT DOCUMENTS

| | | |
|---|---|---|
| JP | 2010108958 A | 5/2010 |
| JP | 4896742 B2 | 3/2012 |
| JP | 2013168608 A | 8/2013 |
| JP | 2013191838 A | 9/2013 |
| JP | 2013545278 A | 12/2013 |
| JP | 2014179375 A | 9/2014 |
| JP | 2014204093 A | 10/2014 |

OTHER PUBLICATIONS

Pilling, "Grain Size", 2004, https://web.archive.org/web/2018*/http://www.mse.mtu.edu/~drjohn/my3200/lab1/grainsize.html, All Pages. (Year: 2004).*
Extended European Search Report issued in European Appln. No. 16186589.4 dated Jan. 9, 2017.
Office Action issued in European Appln. No. 16186589.4 dated Jun. 20, 2018.
Office Action issued in European Appln. No. 16186589.4 dated May 23, 2019.
Office Action issued in Japanese Appln. No. 2015-174340 dated Jun. 18, 2019. English translation provided.

* cited by examiner

THERMOELECTRIC CONVERSION MODULE AND MANUFACTURING METHOD THEREOF

BACKGROUND OF THE INVENTION

Field of Invention

The present invention relates to a thermoelectric conversion module using a thermoelectric element and the manufacturing method thereof.

Background Art

Thermoelectric power generation can convert waste heat generated from a vehicle or at a factory, for example, into electric energy, and thus, much attention has been paid thereto as a power generation method with less environmental burden. A thermoelectric power conversion module used for the thermoelectric power generation has a configuration in which thermoelectric elements arranged in a predetermined pattern are sandwiched by two substrates and generates electric energy according to the temperature difference between the two substrates.

For the purpose of further expanding the usage of the thermoelectric conversion module, it has been demanded that such a thermoelectric conversion module can be implemented under various temperature conditions. In particular, a thermoelectric conversion module has been demanded which has high heat resistance that does not cause damage or performance deterioration even when it is implemented at high temperature no less than 400° C., for example. Japanese Patent No. 4,896,742 discloses a thermoelectric conversion module with high heat resistance.

The thermoelectric conversion module disclosed in Japanese Patent No. 4,896,742 employs a half-Heusler thermoelectric material, which is a high-temperature thermoelectric material, as a thermoelectric element. In addition, in this thermoelectric conversion module, an Ag—Cu alloy-based bonding material with active metal added thereto is used for the bonding of metalized layers (electrodes) of a thermoelectric element and a substrate. For such active metal, Ti, Zr, Hf, Ta, V, and Nb are employed.

PRIOR ART DOCUMENTS

Patent Documents

Patent Document 1: Japanese Patent No. 4,896,742

SUMMARY OF THE INVENTION

Regarding the thermoelectric conversion module disclosed in Japanese Patent No. 4,896,742, since the active metal is expensive and the number of components of the bonding material increases, the manufacturing cost increases. Furthermore, since it is necessary to melt such a bonding material having high melting point for bonding the metalized layers of the thermoelectric element and the substrate, the time and cost are required for heating and cooling.

In consideration of the foregoing circumstances, it is an object of the present invention to provide a thermoelectric conversion module having high heat resistance at comparatively low cost and a manufacturing method thereof.

In order to achieve the abovementioned object, a thermoelectric conversion module according to an aspect of the present invention includes a first substrate, a second substrate, a thermoelectric element, and a bonding layer.

The first substrate includes a first metalized layer.

The second substrate includes a second metalized layer which faces the first metalized layer.

The thermoelectric element includes a chip formed from a thermoelectric material and is arranged between the first metalized layer and the second metalized layer.

The bonding layer is composed of a sintered body of a metallic material having the average crystal particle diameter of no greater than 20 μm and bonds the first metalized layer and the second metalized layer with the thermoelectric element.

In this configuration, metal nano paste containing metallic particles less than 100 nm as a principal component is used for the formation of a bonding layer. In other words, the bonding layer is formed by sintering metallic particles in the metal nano paste (i.e. the bonding layer includes a sintered body of metallic particles having the average primary particle diameter of less than 100 nm as a principal component). With such a configuration, the bonding layer is a sintered body of a metallic material having the average crystal particle diameter of no greater than 20 μm.

In this configuration, it is possible to form a bonding layer at low temperature which is substantially lower than the melting point of the metallic particles without causing the metallic particles to melt. Due to this, it is possible to reduce the manufacturing cost. Furthermore, since the sintered body of the metallic particles, which constitutes the bonding layer, has a high heat resistance, this thermoelectric conversion module can be used at high temperature and also implemented at high temperature.

The thermoelectric material may be a half-Heusler thermoelectric material, a silicide thermoelectric material, a skutterudite thermoelectric material, and a tetrahedrite thermoelectric material, or a combination thereof.

With the thermoelectric conversion module of this configuration, high performance in use at high temperature can be acquired.

The thermoelectric element may further comprise a diffusion prevention layer between the chip and the bonding layer.

With a thermoelectric conversion module of this configuration, it is possible to prevent performance deterioration due to the mutual diffusion of each component of the thermoelectric element and the bonding layer.

Both phosphorus content and sulfur content in the bonding layer may be no greater than 200 ppm.

With a thermoelectric conversion module of this configuration, high long-term reliability can be acquired.

A method of manufacturing a thermoelectric conversion module according to another aspect of the present invention includes the steps of:

providing a paste containing metallic particles less than 100 nm as a principal component;

arranging the paste between a metalized layer provided at a substrate and a thermoelectric element formed from a thermoelectric material; and sintering the metallic particles by heating the paste arranged between the metalized layer and the thermoelectric element.

With this manufacturing method, it is possible to manufacture a thermoelectric conversion module having a high heat resistance.

It should be noted that "particle diameter" refers to a particle diameter based on its volume measured by a scanning electron microscope (SEM) in the present invention. "Average crystal particle diameter" refers to a particle diameter at a point of 50% on accumulative volume when the crystal particle diameters of the 100 crystal particles observed with a scanning electron microscope (SEM) and extracted arbitrarily are measured, and the volumes of the crystal particles are accumulated in ascending order in terms of the particle diameter. "Metallic particle less than 100 nm" refers to metallic particles having the average primary particle diameter of less than 100 nm. "Average particle diameter" refers to a particle diameter at a point of 50% on accumulative volume when particle diameters of 100 particles calculated based on measurement by means of a scanning electron microscope (SEM) are measured, and the volumes of the particles are accumulated in ascending order in terms of the particle diameter. "Principal component" refers to a component having the highest content, and thus, for example, refers to a component accounting for no less than 50 mass %. "Paste containing metallic particles having the average primary particle diameter of less than 100 nm as a principal component" refers to a paste having the average primary particle diameter of a principal component of metallic particles included in the paste of less than 100 nm.

The thermoelectric conversion module and the manufacturing method thereof of the present invention can provide a thermoelectric conversion module having high heat resistance at comparatively low cost and a manufacturing method thereof.

DESCRIPTION OF THE PREFERRED
EMBODIMENTS

Hereinafter, embodiments of the present invention will be described with reference to the drawings.

In the drawings, an X-axis, a Y-axis, and a Z-axis, which are orthogonal to each other as appropriate, are shown. The X-axis, the Y-axis, and the Z-axis are common throughout the drawings.

Overall Configuration of Thermoelectric Conversion Module 10

Figure 1:
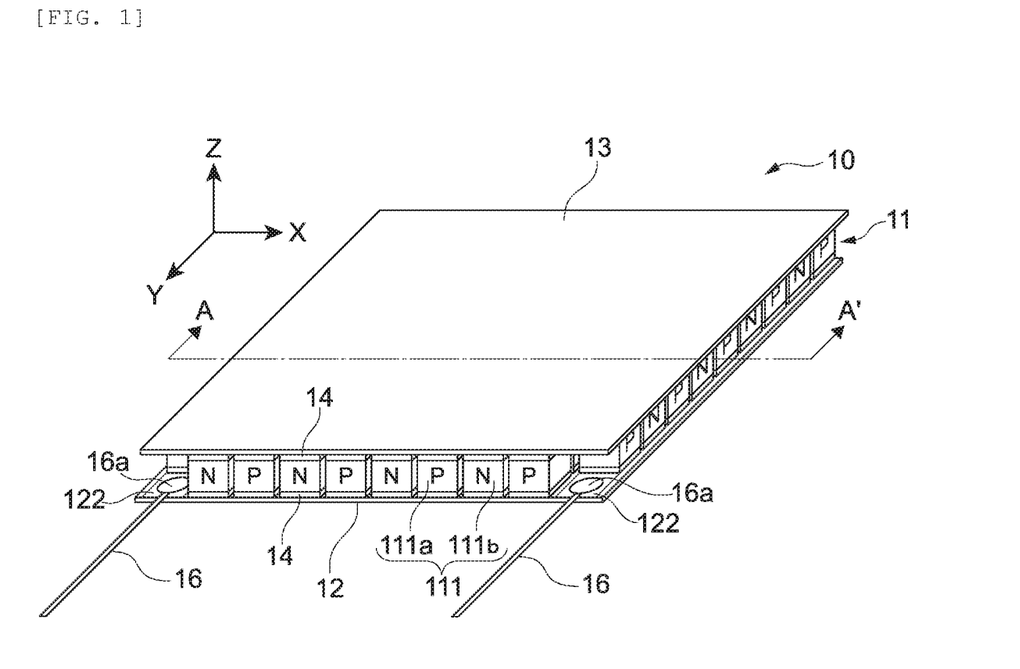
FIG. 1 is a perspective view illustrating a thermoelectric conversion module according to one embodiment of the present invention.

FIG. 1 is a perspective view illustrating a thermoelectric conversion module 10 according to an embodiment of the present invention. The thermoelectric conversion module 10 has a configuration which is particularly adapted for the usage of thermoelectric power generation.

The thermoelectric conversion module 10 includes a first substrate 12, a second substrate 13, a plurality of thermoelectric elements 11, a pair of bonding layers 14, and a pair of lead wires 16.

The first substrate 12 and the second substrate 13 are disposed to face each other. The plurality of thermoelectric elements 11 are configured as a P-type thermoelectric element or an N-type thermoelectric element and are arranged between the substrate 12 and the substrate 13. With one P-type thermoelectric element and one N-type thermoelectric element as a pair, a plurality of pairs thereof are provided. The bonding layers 14 are provided respectively between the substrates 12 and 13 and each of the thermoelectric elements 11. The pair of lead wires 16 is configured as a pair of conductive wires and is bonded with the first substrate 12 via a bonding portion 16a, respectively.

Figure 2:
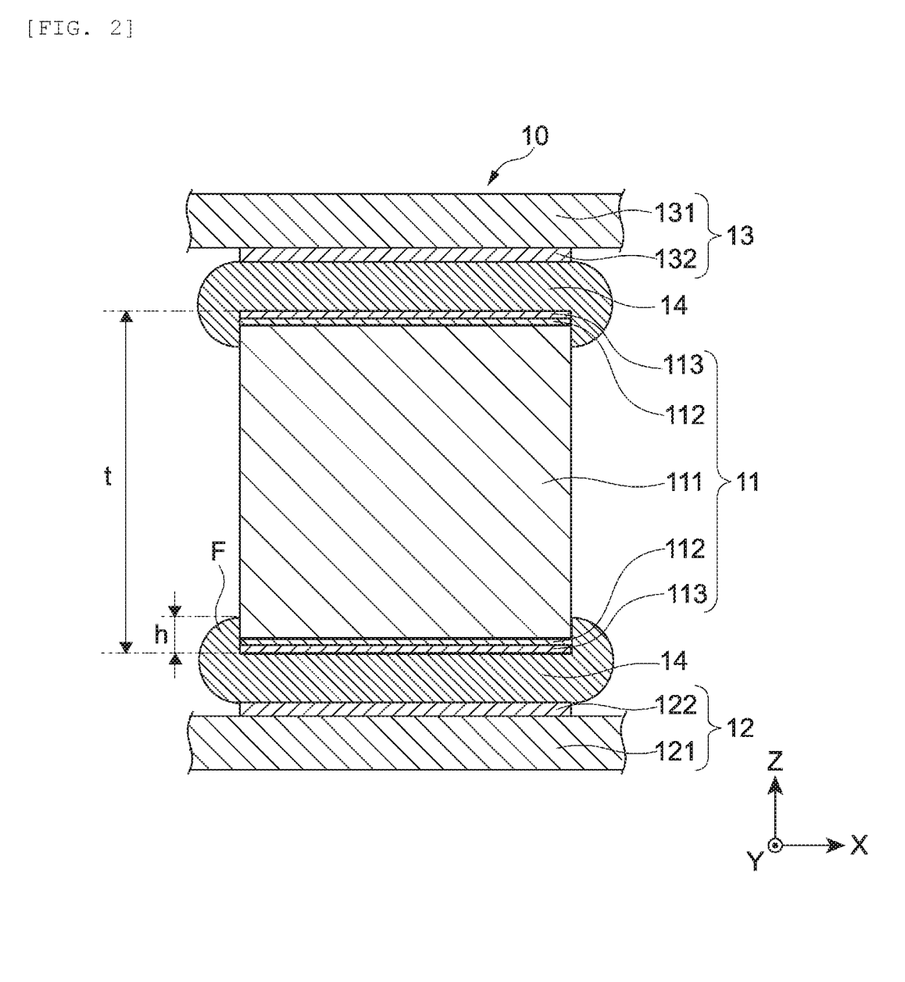
FIG. 2 is a partial cross sectional view of the thermoelectric conversion module of FIG. 1 along the line A-A'.

FIG. 2 is a partial cross-sectional view of the thermoelectric conversion module 10 along the line A-A' of FIG. 1. FIG. 2 illustrates one thermoelectric element 11 and the surrounding thereof in a magnified manner.

The first substrate 12 has a base 121 and a metalized layer 122 and the second substrate 13 has a base 131 and a metalized layer 132 which faces the metalized layer 122.

The bases 121 and 131 are respectively configured as a rectangular flat plate which is parallel to the X-Y plane. The bases 121 and 131 are formed from an insulation material which is superior in heat resistance. Since the conversion efficiency η of the thermoelectric conversion module 10 improves as the thermal conductivity of the bases 121 and 131 is higher, it is preferable that the bases 121 and 131 are formed thinly from a material having high thermal conductivity. As a material for forming the bases 121 and 131, ceramic materials such as aluminum nitride, aluminum oxide, silicon carbide and silicon nitride can be used, for example.

The metalized layers 122 and 132 are configured as electrodes of the first substrate 12 and the second substrate 13, respectively. The metalized layer 122 is formed on an upper face in the Z-axis direction (a face on the thermoelectric element 11 side) of the base 121 of the first substrate 12. The metalized layer 132 is formed on a lower face in the Z-axis direction (a face on the thermoelectric element 11 side) of the base 131 of the second substrate 13. In addition, the metalized layer 122 constitutes the outermost face on the thermoelectric element 11 side of the first substrate 12. The metalized layer 132 constitutes the outermost face of the thermoelectric element 11 side of the base 131 of the second substrate 13. Therefore, the metalized layer 122 of the first substrate 12 and the metalized layer 132 of the second substrate 13 are opposite to each other in the Z-axis direction.

The metalized layers 122 and 132 are formed from an electrically conductive material and are electrically connected with the pair of the thermoelectric elements 11 (the N-type thermoelectric element and the P-type thermoelectric element) on the first substrate 12 and the second substrate 13, respectively. The metalized layers 122 and 132 are patterned so as to serially connect all of the thermoelectric elements 11 between the first substrate 12 and the second substrate 13.

The metalized layers 122 and 132 are formed by performing the metal plating process on the bases 121 and 131, for example. As Metal plating for forming the metalized layers 122 and 132, gold plating, nickel plating, and tin plating are available, for example. Multilayer plating is also available as necessary. The metal plating process can be performed in wafer stage before being divided into the first substrate 12 and the second substrate 13.

Each of the thermoelectric elements 11 includes a chip 111, a pair of diffusion prevention layers 112, and a pair of metalized layers 113. The thermoelectric elements 11 are arranged between the metalized layer 122 of the first substrate 12 and the metalized layer 132 of the second substrate 13. The chip 111 is composed of a P-type chip 111a or an N-type chip 111b. In other words, the thermoelectric elements 11 having the P-type chip 111a are formed as P-type thermoelectric elements and the thermoelectric elements 11 having the N-type chip 111b are formed as N-type thermoelectric elements.

In the thermoelectric conversion module 10, a plurality of the thermoelectric elements 11 are aligned in the X-axis direction and the Y-axis direction except for two corners on one side in the Y-axis direction (one side in the arrangement direction of the plurality of thermoelectric elements 11). With such a configuration, the thermoelectric conversion module 10 has forty nine pairs of the thermoelectric elements 11 which are aligned in the X-axis direction and the Y-axis direction so as to form ten rows, respectively. In other words, forty nine thermoelectric elements 11 having the P-type chip 111a and forty nine thermoelectric elements 11 having the N-type chip 111b are arranged alternately between the substrates 12 and 13.

The chip 111 of the thermoelectric element 11 is formed from a thermoelectric material. Specifically, the P-type chip 111a is formed from a P-type thermoelectric material and the N-type chip 111b is formed from an N-type thermoelectric material.

Regarding the thermoelectric conversion module 10, it is preferable that the chip 111 of the thermoelectric element 11 is formed from a high-temperature thermoelectric material which exhibits favorable performances at comparatively high temperature. With such a configuration, in the thermoelectric conversion module 10, in particular, high performance is acquired in the usage at high temperature. In other words, in a case of heating the second substrate 13 up to higher temperature using waste heat from a vehicle or a factory so as to cause the temperature difference between the first substrate 12 and the second substrate 13 to be greater, as an example, large power generation capacity is attained in particular. In addition, since high heat resistance is acquired in the thermoelectric conversion module 10 as described later, damage or performance deterioration hardly occurs even when it is used at high temperature.

In addition, needless to say, the thermoelectric conversion module 10 can be implemented in the usage at low temperature. According to this feature, the chip 111 of the thermoelectric element 11 may be formed from low-temperature thermoelectric material which exhibits favorable performance at comparatively low temperature. The merit of being capable of being implemented at high temperature can be acquired sufficiently in such a case as well.

A high-temperature thermoelectric material includes, for example, a half-Heusler thermoelectric material, a silicide thermoelectric material, a skutterudite thermoelectric material, and a tetrahedrite thermoelectric material. A low-temperature thermoelectric material includes, for example, a bismuth-tellurium thermoelectric material.

The diffusion prevention layers 112 are provided on each chip 111. The thermoelectric element 11 includes a pair of the diffusion prevention layers 112 between the chip 111 and a pair of the bonding layers 14 (described later). It is preferable that the pair of diffusion prevention layers 112 is overlaid on the entire face on the side of the chip 111 facing the bonding layer 14.

The diffusion prevention layer 112 performs a function for preventing mutual diffusion of each component between the thermoelectric element 11 (specifically, the chip 111) and the bonding layer 14. In other words, it is possible for the diffusion prevention layer 112 to prevent performance deterioration due to the diffusion of the component of the bonding layer 14 into the chip 111 of the thermoelectric element 11. Conversely, it is also possible for the diffusion prevention layer 112 to reduce performance deterioration due to the diffusion of the component of the thermoelectric element 11 into the bonding layer 14.

As a material which forms the diffusion prevention layer 112, metallic materials such as nickel (Ni), palladium (Pd), aluminum (Al), molybdenum (Mo), and titanium (Ti) are available.

In addition, a diffusion prevention layer similarly to the diffusion prevention layer 112 may be provided on the first substrate 12 and the second substrate 13 (specifically, the faces of the first substrate 12 and the second substrate 13 on the side in contact with the bonding layer 14).

It is preferable that the thickness of the diffusion prevention layer 112 is no less than 5 μm. With such a configuration, the diffusion prevention function of the diffusion prevention layer 112 can be favorably acquired even when the thermoelectric conversion module 10 is exposed to high temperature of no less than 400° C., for example, in use or implementation.

The pair of metalized layers 113 is configured as an electrode of the thermoelectric element 11. The pair of metalized layers 113 is formed from an electrically conductive material on the diffusion prevention layers 112 on the upper face and the lower face in the Z-axis direction of each chip 111 (outer faces of the pair of diffusion prevention layers 112). The pair of metalized layers 113 constitutes the outer surface of the thermoelectric element 11. Similarly to the metalized layers 122 and 132 of the first substrate 12 and the second substrate 13, the pair of metalized layers 113 can be formed by the metal plating process, for example. The metal plating process can be performed in wafer stage before being divided into each chip 111.

The pair of bonding layers 14 mechanically couples the first substrate 12 and the second substrate 13 with the thermoelectric element 11 and electrically connects the metalized layers 122 and 132 of the first substrate 12 and the second substrate 13 with the pair of metalized layers 113 of the thermoelectric element 11.

The detailed configuration of the pair of bonding layers 14 will be described later.

The lead wires 16 are bonded via the bonding portions 16a to the two corners on one side of the first substrate 12 in the Y-axis direction (one side in the arrangement direction of the plurality of thermoelectric elements 11) and are led out to one side in the Y-axis direction. In other words, the lead wires 16 are connected with the metalized layer 122 at the two locations on the first substrate 12 at which the thermoelectric elements 11 are not arranged. With such a configuration, each of the lead wires 16 is electrically connected with adjacent thermoelectric elements 11 in the Y-axis direction via the metalized layer 122.

It is preferable that the bonding portions 16a are formed from a material having a high melting point. As a material which forms the bonding portions 16a, a gold-silicon solder and a gold-germanium solder are available, for example.

With such a configuration as described above, in the thermoelectric conversion module 10, all of the thermoelectric elements 11 are serially connected between the pair of lead wires 16. Thus, in the thermoelectric conversion module 10, it is possible to favorably perform thermoelectric power generation which converts the temperature difference between the first substrate 12 and the second substrate 13 into the electric potential difference between the pair of lead wires 16.

Although the typical configuration of the thermoelectric conversion module 10 according to the present embodiment is described as above, needless to say, the thermoelectric conversion module 10 can adopt a variety of configurations depending on its usage and the like. For example, the abovementioned configuration can be modified as necessary in terms of, for example, the number and the arrangement of the thermoelectric elements 11, the type of a thermoelectric material which forms the chip 111 of the thermoelectric element 11, and the shape of the substrates 12 and 13.

Bonding Layer 14

The bonding layer 14 is formed from metal nano paste containing metal particles less than 100 nm as a principal component. In other words, the bonding layer 14 is formed by sintering the metal particles in the metal nano paste (i.e., the bonding layer 14 includes a sintered body of the metal particles having the average primary particle diameter of less than 100 nm as a principal component). Thus, the bonding layer 14 is a sintered body of a metallic material, and more specifically, is a polycrystal substance of a metallic material having the average crystal particle diameter of no greater than 20 μm.

The metallic particles of metal nano paste can be sintered at low temperature of approximately 100° C. to 300° C., for example. Therefore, it is possible to perform the process of forming the bonding layer 14 at low temperature. In this way, it is possible to form the bonding layer 14 with low cost without causing the metallic particles to melt. Furthermore, it is preferable that the heating temperature when forming the bonding layer 14 is set so as to be low temperature at which the average crystal particle diameter of the polycrystal substance which constitutes the bonding layer 14 is no greater than 10 μm.

On the other hand, the bonding layer 14 has a high melting point according to a metallic material which constitutes the bonding layer 14. Due to this, in the thermoelectric conversion module 10 having the bonding layer 14, the bonding layer 14 is not melted even in a case of being exposed to high temperature no less than 400° C. and the connection between the first substrate 12 and the second substrate 13 and the thermoelectric element 11 can be sustained favorably. In other words, the thermoelectric conversion module 10 can properly maintain the function even after being implemented at high temperature no less than 400° C. Furthermore, the thermoelectric conversion module 10 hardly causes damage or performance deterioration even when it is used at high temperature no less than 400° C.

In this way, with the thermoelectric conversion module 10 according to the present embodiment, high heat resistance can be acquired with low cost.

Metal nano paste includes, for example, silver nano paste containing silver particles less than 100 nm as a principal component. As silver nano paste, silver nano paste produced by DOWA Electronics Materials Co., Ltd., NAG-10 produced by DAIKEN CHEMICAL CO., LTD., and MDot (Registered Trademark) produced by Mitsuboshi Belting Ltd., are available, for example.

In addition, metal nano paste is not limited to silver nano paste and may be copper nano paste containing copper particles less than 100 nm as a principal component, for example.

In addition, it is preferable that both the phosphorus (P) content and the sulfur (S) content in the bonding layer 14 are no greater than 200 ppm. With such a configuration, it is confirmed that the high long-term reliability can be acquired in the thermoelectric conversion module 10 having the bonding layer 14.

The phosphorus and sulfur in the bonding layer 14 are assumed to diffuse from the pair of metalized layers 113 of the thermoelectric element 11 and/or the metalized layers 122 and 132 of the first substrate 12 and the second substrate 13. Therefore, it is possible to reduce the phosphorus and sulfur contents in the bonding layer 14 by reducing the phosphorus and sulfur contents in the metalized layers 113, 122, and 132.

In this regard, it is confirmed that the phosphorus and sulfur contents in the metalized layers 113, 122, and 132 easily increase in a case of forming the metalized layers 113, 122, and 132 using electroless plating. Therefore, it is possible to reduce the phosphorus and sulfur contents in the bonding layer 14 by forming the metalized layers 113, 122, and 132 using electroplating without using electroless plating, for example.

With such a configuration, the high long-term reliability of the thermoelectric conversion module 10 can be acquired.

In addition, a fillet F as illustrated in FIG. 2 is formed by providing the bonding layer 14 so as to partially cover the side face of the thermoelectric element 11 in the process of manufacturing the thermoelectric conversion module 10.

In the thermoelectric conversion module 10, the conversion efficiency η decreases as the height h of the fillet F in the Z-axis direction (the facing direction of the first substrate 12 and the second substrate 13) is higher. In other words, in the thermoelectric conversion module 10, the higher conversion efficiency η can be acquired as the height h of the fillet F is lower. Specifically, it is confirmed that the particularly favorable conversion efficiency η can be acquired in a case in which the height h of the fillet F in each bonding layer 14 is no greater than 20% of the height t of the thermoelectric element 11 in the Z-axis direction.

Therefore, in the thermoelectric conversion module 10, it is preferable that the height h of the fillet F in each bonding layer 14 is set so as to be no greater than 20% of the height t of the thermoelectric element 11 by adjusting firing temperature, etc. when forming the bonding layer 14, for example.

Manufacturing Method of Thermoelectric Conversion Module 10

Figure 3:
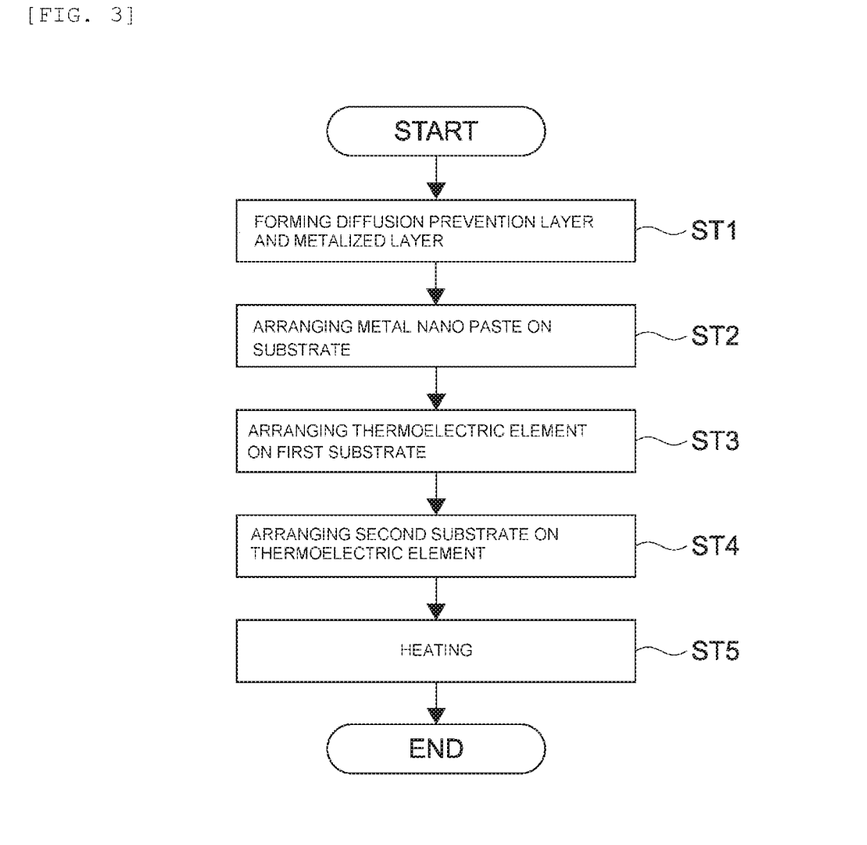
FIG. 3 is a flowchart illustrating a method of manufacturing the thermoelectric conversion module of FIG. 1.

FIG. 3 is a flowchart illustrating an example of a method of manufacturing the thermoelectric conversion module 10 according to the present embodiment. FIG. 4 is a partial cross sectional view illustrating the process of manufacturing the thermoelectric conversion module 10. Hereinafter, the method of manufacturing the thermoelectric conversion module 10 will be described according to FIG. 3 with reference to FIG. 4 as necessary.

Step ST1

In Step ST1, the diffusion prevention layer 112 and the metalized layer 113 are formed on the thermoelectric element 11. In Step ST1, the diffusion prevention layer 112 is provided on the chip 111, and the metalized layer 113 is provided on the diffusion prevention layer 112. Specifically, in Step ST1, the diffusion prevention layers 112 are respectively overlaid on the opposite faces of the chip 111, and the metalized layers 113 are respectively overlaid on the outer faces of each diffusion prevention layer 112. Various types of film forming methods can be employed for the formation of the diffusion prevention layers 112 and the metalized layers 113. It is preferable that the diffusion prevention layer 112 is formed so that the thickness thereof is no less than 5 μm.

Step ST2

In Step ST2, metal nano paste 141 is respectively arranged on the metalized layers 122 and 132 of the first substrate 12 and the second substrate 13.

Figure 4A:
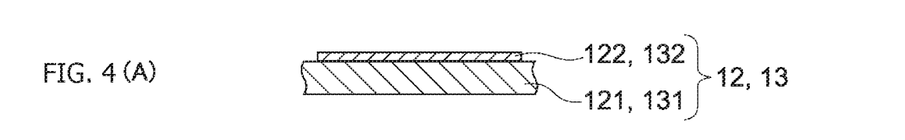
FIGS. 4(A)-4(D) are partial cross sectional views illustrating the method of manufacturing the thermoelectric conversion module of FIG. 1.
Figure 4B:
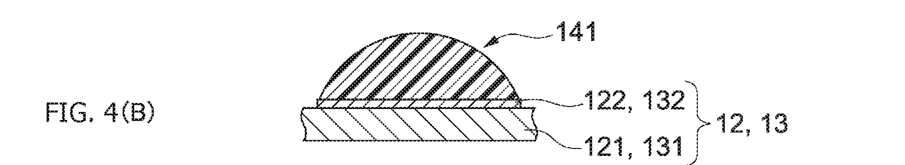

FIG. 4(A) illustrates the first substrate 12 and the second substrate 13 prior to Step ST2. FIG. 4(B) illustrates the first substrate 12, the second substrate 13, and the metal nano paste 141 after Step ST2. The metal nano paste 141 is made by impasting metallic particles less than 100 nm with solvent, etc.

In Step ST2, the metal nano paste 141 is arranged at a location on the first substrate 12 and the second substrate 13 at which each of the thermoelectric elements 11 is arranged. The metal nano paste 141 is arranged by way of the printing process such as screen printing and the discharging process using a dispenser, etc.

Step ST3

In Step ST3, the thermoelectric element 11 is arranged on the first substrate 12 on which the metal nano paste 141 was arranged in Step ST2. Thus, the thermoelectric element 11 is arranged so that the metalized layer 113 at the lower side in the Z-axis direction faces the metalized layer 122 of the first substrate 12 via the metal nano paste 141.

Figure 4C:
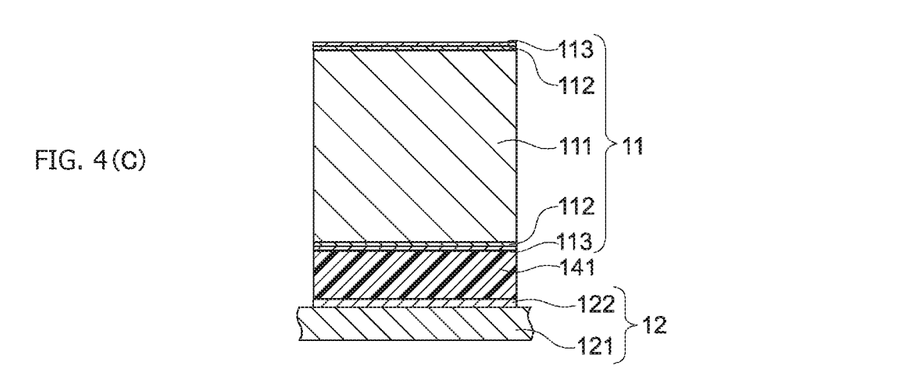

FIG. 4(C) illustrates the first substrate 12, the metal nano paste 141, and the thermoelectric element 11 after Step ST3. The thermoelectric element 11 is arranged on the first substrate 12 so that the metal nano paste 141 spreads over the entire area of the metalized layer 113 at the lower side in the Z-axis direction. Thus, the metal nano paste 141 is introduced between the metalized layer 122 of the first substrate 12 and the metalized layer 113 of the thermoelectric element 11.

Step ST4

In Step ST4, the second substrate 13 is arranged on the thermoelectric element 11 which has been arranged on the metal nano paste 141 in Step ST3. Thus, the second substrate 13 is arranged so that the metalized layer 132 faces the metalized layer 113 at the upper side in the Z-axis direction of the thermoelectric element 11 via the metal nano paste 141 which has been arranged in Step ST2.

Figure 4D:
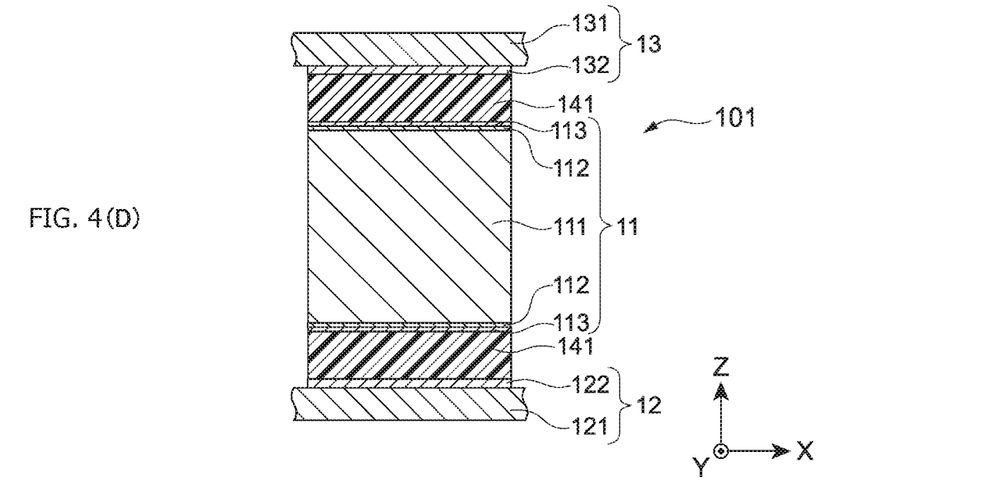

FIG. 4(D) illustrates the substrates 12 and 13, the metal nano paste 141, and the thermoelectric element 11 after Step ST4. The second substrate 13 is arranged on the thermoelectric element 11 so that the metal nano paste 141 spreads over the entire area of the metalized layer 113 at the upper side in the Z-axis direction of the thermoelectric element 11. With such a configuration, the metal nano paste 141 is also introduced between the metalized layer 132 of the second substrate 13 and the metalized layer 113 of the thermoelectric element 11.

With Step ST4, an assembly 101 can be obtained which is configured with the substrates 12 and 13, the metal nano paste 141, and the thermoelectric element 11.

Step ST5

In Step ST5, the bonding layer 14 illustrated in FIGS. 1 and 2 is formed by heating the assembly 101 obtained in Step ST4, whereby the first substrate 12 and the second substrate 13 are bonded with the thermoelectric element 11 via the bonding layer 14.

More specifically, in Step ST5, the assembly 101 illustrated in FIG. 4(D) is heated so that a solvent, etc. other than the metallic powder included in the metal nano paste 141 is removed and the metallic powder is sintered. By such processing, the bonding layer 14 composed of a sintered body of the metallic powder (the bonding layer 14 composed of a sintered body of the metallic powder having the average primary particle diameter of less than 100 nm) is formed between the first substrate 12 and the thermoelectric element 11, and between the second substrate 13 and the thermoelectric element 11, and the metalized layer 122 of the first substrate 12 and the metalized layer 132 of the second substrate 13 are bonded with the metalized layers 113 of the thermoelectric element 11, respectively, via the bonding layer 14.

The heating temperature of the assembly 101 in Step ST5 can be determined as appropriate within the range in which the metallic powder of the metal nano paste 141 can be sintered. In addition, it is preferable that the heating temperature of the assembly 101 is determined so that the height h of the fillet F at the bonding layer 14 is low. Specifically, the heating temperature of the assembly 101 can be set to 100° C. to 300° C., for example. As a heating means in Step ST5, an electric furnace and a reflow furnace can be employed, for example.

In addition, in Step ST5, when heating the assembly 101, pressure in the Z-axis direction which presses the first substrate 12 and the second substrate 13 toward the thermoelectric element 11 side may be applied to the assembly 101. Since the application of such pressure leads to an increase of the density of the bonding layer 14, the bonding layer 14 with higher strength can be obtained.

As described above, the thermoelectric conversion module 10 according to the present embodiment is manufactured by arranging the metal nano paste 141 containing metallic particles less than 100 nm as a principal component between the metalized layers 123 and 132 provided at the first substrate 12 and the second substrate 13, respectively, and the thermoelectric element 11 having the chip 111 formed from the thermoelectric material, and sintering the metallic particles by heating this metal nano paste 141. In other words, the manufacturing method of the thermoelectric conversion module 10 includes the steps of: providing a paste containing metallic particles less than 100 nm as a principal component; arranging the paste between the metalized layers 122 and 132 provided at the first substrate 12 and the second substrate 13, respectively, and the thermoelectric element 11 having the chip 111 formed from the thermoelectric material; and sintering the metallic particles by heating the paste arranged between the metalized layers 122 and 132 and the thermoelectric element 11.

Subsequent Step

After Step ST5, a lead wire connecting step of connecting the lead wire 16 with the first substrate 12, a cleaning step so as to remove residue of the metal nano paste, etc., and an inspection step so as to perform various kinds of inspections, for example, are performed as necessary, and, as a result, the thermoelectric conversion module 10 illustrated in FIG. 1 is completed.

EXAMPLES

Although Examples of the abovementioned embodiments will be shown in the following, the present invention is not limited to the Examples.

In each of the examples 1 to 5, samples of the thermoelectric conversion module 10 were prepared using different kinds of thermoelectric materials, respectively, and each sample was evaluated.

Example 1

(a) Sample Preparation

In Example 1, Samples 1-1 to 1-6 of the thermoelectric conversion module 10 were prepared using a bismuth-tellurium thermoelectric material. The composition of the P-type thermoelectric material was $Bi_{0.4}Sb_{1.6}Te_3$, and the composition of the N-type thermoelectric material was $Bi_{1.9}Sb_{0.1}Te_{2.7}Se_{0.3}$. The thermoelectric material was prepared by solidification molding a liquid quenched foil-like powder according to the hot pressing process.

In Samples 1-1 to 1-6 of the thermoelectric conversion module 10, the dimension of the first substrate 12 was set to 40 mm×40 mm×1.5 mm in thickness, the dimension of the second substrate 13 was set to 40 mm×43 mm×1.5 mm in thickness, and the number of pairs of the thermoelectric elements 11 was set to fifty pairs.

Table 1 shows the types of the bonding material (metal nano paste) for forming the bonding layer 14, the sulfur content in the bonding layer 14, and the phosphorus content in the bonding layer 14 in each of Samples 1-1 to 1-6. It should be noted that metal nano pastes containing metallic particles having the average primary particle diameter of less than 100 nm were employed in the present Example as "metal nano paste".

TABLE 1

| Sample | Bonding material | Sulfur content | Phosphorus content |
|---|---|---|---|
| 1-1 | Silver nano paste | 80 ppm | 70 ppm |
| 1-2 | Copper nano paste | 66 ppm | 82 ppm |
| 1-3 | Silver nano paste | 218 ppm | 66 ppm |
| 1-4 | Silver nano paste | 68 ppm | 236 ppm |
| 1-5 | Copper nano paste | 220 ppm | 82 ppm |
| 1-6 | Copper nano paste | 70 ppm | 210 ppm |

In Samples 1-1, 1-3, and 1-4, silver nano paste was employed as the bonding material for forming the bonding layer 14. In Samples 1-2, 1-5, and 1-6, copper nano paste was employed as the boding material for forming the bonding layer 14.

In Samples 1-1 and 1-2, both the sulfur content and the phosphorus content in the bonding layer 14 were no greater than 200 ppm. In Samples 1-3 and 1-5, the sulfur content in the bonding layer 14 was greater than 200 ppm. In Samples 1-4 and 1-6, the phosphorus content in the bonding layer 14 was greater than 200 ppm.

(b) Thermal Cycling Test

Initially, the thermal cycling test was performed for each of Samples 1-1 to 1-6. In the thermal cycling test, for each of Samples 1-1 to 1-6, increase and decrease in temperature of the second substrate 13 was repeatedly performed in a state of maintaining the first substrate 12 at 100° C. More specifically, the cycle of maintaining the second substrate 13 at 100° C. for 5 minutes, raising the temperature up to 400° C. and maintaining the second substrate 13 at 400° C. for 5 minutes, and cooling the second substrate 13 down to 100° C. was performed 10,000 times. Thus, the maximum temperature difference between the first substrate 12 and the second substrate 13 was 300° C.

Table 2 shows the results of measuring alternating current electric resistance in a state of maintaining the second substrate 13 at 100° C. at each specified number of cycles for each of Samples 1-1 to 1-6. The alternating current electric resistance at each specified number of cycles is shown as the change ratio (%) relative to the alternating current electric resistance prior to the thermal cycling test (0 cycles).

Table 3 shows the results of measuring the power generation capacity (W) in a state of maintaining the second substrate 13 at 400° C. at each specified number of cycles for each of Samples 1-1 to 1-6.

TABLE 2

| | Number of cycles | | | | | | |
|---|---|---|---|---|---|---|---|
| | 0 | 1,000 | 2,000 | 3,000 | 5,000 | 7,000 | 10,000 |
| Sample 1-1 | 0% | 0% | 0.1% | 0.1% | 0.2% | 0.2% | 0.2% |
| Sample 1-2 | 0% | 0% | 0.1% | 0.1% | 0.2% | 0.2% | 0.2% |
| Sample 1-3 | 0% | 0% | 0.1% | 0.1% | 0.2% | 0.2% | 0.2% |
| Sample 1-4 | 0% | 0% | 0.1% | 0.1% | 0.2% | 0.2% | 0.2% |
| Sample 1-5 | 0% | 0% | 0.1% | 0.1% | 0.2% | 0.2% | 0.2% |
| Sample 1-6 | 0% | 0% | 0.1% | 0.1% | 0.2% | 0.2% | 0.2% |

TABLE 3

| | Number of cycles | | | | | | |
|---|---|---|---|---|---|---|---|
| | 0 | 1,000 | 2,000 | 3,000 | 5,000 | 7,000 | 10,000 |
| Sample 1-1 | 15.1 W | 15.1 W | 15.1 W | 15.1 W | 15.1 W | 15.1 W | 15.1 W |
| Sample 1-2 | 14.8 W | 14.8 W | 14.8 W | 14.8 W | 14.8 W | 14.8 W | 14.8 W |
| Sample 1-3 | 15.1 W | 15.1 W | 15.1 W | 13.2 W | 12.1 W | 10.1 W | 10.1 W |
| Sample 1-4 | 15.1 W | 15.1 W | 15.1 W | 13.4 W | 12.1 W | 9.8 W | 8.7 W |
| Sample 1-5 | 14.8 W | 14.8 W | 14.8 W | 14.2 W | 13.7 W | 10.3 W | 9.8 W |
| Sample 1-6 | 14.8 W | 14.8 W | 14.8 W | 13.8 W | 12.8 W | 11.9 W | 9.8 W |

With reference to Table 2, in all of Samples 1-1 to 1-6, the change ratio of the alternating current electric resistance at 10,000 cycles were at most approximately 0.2%.

Furthermore, with reference to Table 3, the power generation capacity (W) did not change up to 10,000 cycles in Samples 1-1 and 1-2. On the other hand, in Samples 1-3 to 1-6, the power generation capacity started to fall at around 3,000 cycles and fell by approximately 5 W at 10,000 cycles. In view of this, it is found that higher long-term reliability can be acquired by setting the sulfur and phosphorus contents to be no greater than 200 ppm.

Furthermore, with reference to Table 2 and Table 3, the difference in performance between Samples 1-1, 1-3, and 1-4 employing the silver nano paste and Samples 1-2, 1-5, and 1-6 employing the copper nano paste cannot be found (any significant difference in the decreasing ratio of the power generation capacity (W) depending on the number of cycles cannot be found). In view of this, it is found that the long-term reliability is not affected irrespective of which of the silver nano paste or the copper nano paste is employed.

(c) Conversion Efficiency η

Next, a plurality of the abovementioned Samples 1-1 and 1-2 in which the height h of the fillet F differed were prepared, and the conversion efficiency η was measured for each of Samples 1-1 and 1-2. The measurement of the conversion efficiency η as performed with the first substrate being maintained at 100° C. and the second substrate 13 being maintained at 350° C., i.e., with the maximum temperature difference between the first substrate 12 and the second substrate 13 being 250° C.

Table 4 shows the fillet height and the measurement result of the conversion efficiency η for Samples 1-1 and 1-2. The fillet height in each of Samples 1-1 and 1-2 is shown as the ratio (%) of the height h of the fillet F to the height t of the thermoelectric element 11.

TABLE 4

| Sample | Fillet height | Conversion efficiency η |
| --- | --- | --- |
| 1-1 | 15% | 5.1% |
| 1-1 | 23% | 4.5% |
| 1-1 | 27% | 4.1% |
| 1-1 | 30% | 4.1% |
| 1-2 | 15% | 5.0% |
| 1-2 | 24% | 4.7% |
| 1-2 | 27% | 4.1% |
| 1-2 | 30% | 4.0% |

With reference to Table 4, in all of Samples 1-1 and 1-2, it can be found that the conversion efficiency η tends to decrease as the fillet height is higher. In particular, the high conversion efficiency η approximately around 5% can be attained for samples from Samples 1-1 and 1-2 in which the fillet height was no greater than 20%.

Example 2

(a) Sample Preparation

In Example 2, Samples 2-1 to 2-4 of the thermoelectric conversion module 10 were prepared using a silicide thermoelectric material. The composition of the P-type thermoelectric material was MnSi1.7, and the composition of the N-type thermoelectric material was $Mg_2Si_{0.4}Sn_{0.6}$. The thermoelectric material was prepared by solidification molding a powder manufactured according to the mechanical alloying (MA) process, according to the spark plasma sintering (SPS) process.

The configuration other than the thermoelectric materials of Samples 2-1 to 2-4 of the thermoelectric conversion module 10 was the same as Samples 1-1 to 1-6 according to Example 1.

Table 5 shows the types of the bonding material (metal nano paste) for forming the bonding layer 14, the sulfur content in the bonding layer 14, and the phosphorus content in the bonding layer 14 in each of Samples 2-1 to 2-4.

TABLE 5

| Sample | Bonding material | Sulfur content | Phosphorus content |
| --- | --- | --- | --- |
| 2-1 | Silver nano paste | 143 ppm | 70 ppm |
| 2-2 | Copper nano paste | 58 ppm | 93 ppm |
| 2-3 | Silver nano paste | 232 ppm | 157 ppm |
| 2-4 | Silver nano paste | 50 ppm | 227 ppm |

In Samples 2-1, 2-3, and 2-4, silver nano paste was employed as the bonding material for forming the bonding layer 14. In Sample 2-2, copper nano paste was employed as a boding material for forming the bonding layer 14.

In Samples 2-1 and 2-2, both the sulfur content and the phosphorus content in the bonding layer 14 were no greater than 200 ppm. In Sample 2-3, the sulfur content in the bonding layer 14 was greater than 200 ppm. In Sample 2-4, the phosphorus content in the bonding layer 14 was greater than 200 ppm.

(b) Thermal Cycling Test

Initially, the thermal cycling test was performed for each of Samples 2-1 to 2-4. In the thermal cycling test, for each of Samples 2-1 to 2-4, increase and decrease in temperature of the second substrate 13 was repeatedly performed in a state of maintaining the first substrate 12 at 100° C. More specifically, the cycle of maintaining the second substrate 13 at 100° C. for 5 minutes, raising the temperature up to 550° C. and maintaining the second substrate 13 at 550° C. for 5 minutes, and cooling the second substrate 13 down to 100° C. was performed 10,000 times. Thus, the maximum temperature difference between the first substrate 12 and the second substrate 13 was 450° C.

Table 6 shows the results of measuring alternating current electric resistance in a state of maintaining the second substrate 13 at 100° C. at each specified number of cycles for each of Samples 2-1 to 2-4. The alternating current electric resistance at each specified number of cycles is shown as the change ratio (%) relative to the alternating current electric resistance prior to the thermal cycling test (0 cycles).

Table 7 shows the results of measuring the power generation capacity (W) in a state of maintaining the second substrate 13 at 550° C. at each specified number of cycles for each of Samples 2-1 to 2-4.

TABLE 6

| | Number of cycles | | | | | | |
| --- | --- | --- | --- | --- | --- | --- | --- |
| | 0 | 1,000 | 2,000 | 3,000 | 5,000 | 7,000 | 10,000 |
| Sample 2-1 | 0% | 0% | 0.1% | 0.2% | 0.6% | 1.0% | 1.2% |
| Sample 2-2 | 0% | 0% | 0.1% | 0.2% | 0.6% | 1.0% | 1.2% |
| Sample 2-3 | 0% | 0% | 0.1% | 0.2% | 0.6% | 1.0% | 1.2% |
| Sample 2-4 | 0% | 0% | 0.1% | 0.2% | 0.6% | 1.0% | 1.2% |

TABLE 7

| | Number of cycles | | | | | | |
|---|---|---|---|---|---|---|---|
| | 0 | 1,000 | 2,000 | 3,000 | 5,000 | 7,000 | 10,000 |
| Sample 2-1 | 13.4 W | 13.4 W | 13.4 W | 13.4 W | 13.1 W | 13.1 W | 13.0 W |
| Sample 2-2 | 12.9 W | 12.9 W | 12.9 W | 12.9 W | 12.9 W | 12.8 W | 12.7 W |
| Sample 2-3 | 13.4 W | 13.4 W | 13.4 W | 11.2 W | 9.8 W | 9.5 W | 7.9 W |
| Sample 2-4 | 13.4 W | 13.4 W | 13.4 W | 12.8 W | 11.9 W | 10.5 W | 9.8 W |

With reference to Table 6, in all of Samples 2-1 to 2-4, the change ratio of the alternating current electric resistance at 10,000 cycles were at most approximately 1.2%.

Furthermore, with reference to Table 7, the power generation capacity (W) hardly changed up to 10,000 cycles in Samples 2-1 and 2-2. On the other hand, in Samples 2-3 and 2-4, the power generation capacity started to fall at around 3,000 cycles and fell by at least 3 W at 10,000 cycles. Thus, it is found that higher long-term reliability can be acquired by setting both the sulfur and phosphorus contents to be no greater than 200 ppm.

Furthermore, with reference to Table 6 and Table 7, the difference in performance between Sample 2-1 employing the silver nano paste and Sample 2-2 employing the copper nano paste cannot be found (any significant difference in the decreasing ratio of the power generation capacity (W) depending on the number of cycles cannot be found). In view of this, it is found that the long-term reliability is not affected irrespective of which of the silver nano paste or the copper nano paste is employed.

(c) Conversion Efficiency η

Next, a plurality of the abovementioned Samples 2-1 and 2-2 in which the height h of the fillet F differed were prepared, and the conversion efficiency η was measured for each of Samples 2-1 and 2-2. The measurement of the conversion efficiency η was performed with the first substrate 12 being maintained at 100° C. and the second substrate 13 being maintained at 550° C., i.e., with the maximum temperature difference between the first substrate 12 and the second substrate 13 being 450° C.

Table 8 shows the fillet height and the measurement result of the conversion efficiency η for Samples 2-1 and 2-2. The fillet height in each of Samples 2-1 and 2-2 is shown as the ratio (%) of the height h of the fillet F to the height t of the thermoelectric element 11.

TABLE 8

| Sample | Fillet height | Conversion efficiency η |
|---|---|---|
| 2-1 | 11% | 3.4% |
| 2-1 | 22% | 3.1% |
| 2-1 | 30% | 2.8% |
| 2-1 | 32% | 2.4% |
| 2-2 | 15% | 3.4% |
| 2-2 | 23% | 2.9% |
| 2-2 | 29% | 2.6% |
| 2-2 | 32% | 2.4% |

With reference to Table 8, in all of Samples 2-1 and 2-2, it can be found that the conversion efficiency η tends to decrease as the fillet height is higher. In particular, the high conversion efficiency η approximately around 3.4% can be attained for samples from Samples 2-1 and 2-2 in which the fillet height was no greater than 20%.

Example 3

(a) Sample Preparation

In Example 3, Samples 3-1 to 3-4 of the thermoelectric conversion module 10 were prepared using a half-Heusler thermoelectric material. The composition of the P-type thermoelectric material was $(Ti_{0.35}Zr_{0.31}Hf_{0.35})Ni(Sn_{0.15}Sb_{0.85})$, and the composition of the N-type thermoelectric material was $(Ti_{0.35}Zr_{0.35}Hf_{0.3})Ni(Sn_{0.997}Sb_{0.003})$. The thermoelectric material was prepared by solidification molding a powder manufactured according to the MA process, according to the hot isostatic pressing (HIP) process.

The configuration other than the thermoelectric materials of Samples 3-1 to 3-4 of the thermoelectric conversion module 10 was the same as Samples 1-1 to 1-6 according to Example 1.

Table 9 shows the types of the bonding material (metal nano paste) for forming the bonding layer 14, the sulfur content in the bonding layer 14, and the phosphorus content in the bonding layer 14 in each of Samples 3-1 to 3-4.

TABLE 9

| Sample | Bonding material | Sulfur content | Phosphorus content |
|---|---|---|---|
| 3-1 | Silver nano paste | 50 ppm | 167 ppm |
| 3-2 | Copper nano paste | 66 ppm | 82 ppm |
| 3-3 | Silver nano paste | 211 ppm | 75 ppm |
| 3-4 | Silver nano paste | 111 ppm | 275 ppm |

In Samples 3-1, 3-3, and 3-4, silver nano paste was employed as the bonding material for forming the bonding layer 14. In Sample 3-2, copper nano paste was employed as a boding material for forming the bonding layer 14.

In Samples 3-1 and 3-2, both the sulfur content and the phosphorus content in the bonding layer 14 were no greater than 200 ppm. In Sample 3-3, the sulfur content in the bonding layer 14 was greater than 200 ppm. In Sample 3-4, the phosphorus content in the bonding layer 14 was greater than 200 ppm.

(b) Thermal Cycling Test

Initially, the thermal cycling test was performed for each of Samples 3-1 to 3-4 in the same manner performed in Example 2.

Table 10 shows the results of measuring alternating current electric resistance in a state of maintaining the second substrate 13 at 100° C. at each specified number of cycles for each of Samples 3-1 to 3-4. The alternating current electric resistance at each specified number of cycles is shown as the change ratio (%) relative to the alternating current electric resistance prior to the thermal cycling test (0 cycles).

Table 11 shows the results of measuring the power generation capacity (W) in a state of maintaining the second substrate 13 at 550° C. at each specified number of cycles for each of Samples 3-1 to 3-4.

TABLE 10

| | Number of cycles | | | | | |
|---|---|---|---|---|---|---|
| | 0 | 1,000 | 2,000 | 3,000 | 5,000 | 7,000 | 10,000 |
| Sample 3-1 | 0% | 0% | 0.1% | 0.1% | 0.2% | 0.3% | 0.3% |
| Sample 3-2 | 0% | 0% | 0% | 0.1% | 0.1% | 0.2% | 0.2% |
| Sample 3-3 | 0% | 0% | 0.1% | 0.1% | 0.2% | 0.3% | 0.3% |
| Sample 3-4 | 0% | 0% | 0.1% | 0.1% | 0.2% | 0.3% | 0.3% |

TABLE 11

| | Number of cycles | | | | | |
|---|---|---|---|---|---|---|
| | 0 | 1,000 | 2,000 | 3,000 | 5,000 | 7,000 | 10,000 |
| Sample 3-1 | 23.2 W | 23.2 W | 23.2 W | 23.2 W | 23.2 W | 23.2 W | 23.1 W |
| Sample 3-2 | 23.4 W | 23.4 W | 23.4 W | 23.4 W | 23.3 W | 23.3 W | 23.2 W |
| Sample 3-3 | 23.2 W | 23.2 W | 23.2 W | 23.2 W | 22.1 W | 20.3 W | 19.8 W |
| Sample 3-4 | 23.2 W | 23.2 W | 23.2 W | 23.2 W | 22.8 W | 19.8 W | 18.7 W |

With reference to Table 10, in all of Samples 3-1 to 3-4, the change ratio of the alternating current electric resistance at 10,000 cycles were at most approximately 0.2% to 0.3%.

Furthermore, with reference to Table 11, the power generation capacity (W) hardly changed up to 10,000 cycles in Samples 3-1 and 3-2. On the other hand, in Samples 3-3 and 3-4, the power generation capacity started to fall at around 5,000 cycles and fell by at least 3 W at 10,000 cycles. In view of this, it is found that higher long-term reliability can be acquired by setting both the sulfur and phosphorus contents to be no greater than 200 ppm.

Furthermore, with reference to Table 10 and Table 11, the difference in performance between Sample 3-1 employing the silver nano paste and Sample 3-2 employing the copper nano paste cannot be found (any significant difference in the decreasing ratio of the power generation capacity (W) depending on the number of cycles cannot be found). In view of this, it is found that the long-term reliability is not affected irrespective of which of the silver nano paste or the copper nano paste is employed.

(c) Conversion Efficiency η

Next, a plurality of the abovementioned Samples 3-1 and 3-2 in which the height h of the fillet F differed were prepared, and the conversion efficiency η was measured for each of Samples 3-1 and 3-2 in the same manner performed in Example 2.

Table 12 shows the fillet height and the measurement result of the conversion efficiency η for Samples 3-1 and 3-2. The fillet height in each of Samples 3-1 and 3-2 is shown as the ratio (%) of the height h of the fillet F to the height t of the thermoelectric element 11.

TABLE 12

| sample | Fillet height | Conversion efficiency η |
|---|---|---|
| 3-1 | 17% | 5.5% |
| 3-1 | 23% | 5.2% |
| 3-1 | 27% | 4.8% |
| 3-1 | 30% | 4.8% |
| 3-2 | 12% | 5.5% |
| 3-2 | 24% | 5.2% |
| 3-2 | 29% | 4.8% |
| 3-2 | 33% | 4.8% |

With reference to Table 12, in all of Samples 3-1 and 3-2, it can be found that the conversion efficiency η tends to decrease as the fillet height is higher. In particular, the high conversion efficiency η approximately around 5.5% can be attained for samples from Samples 3-1 and 3-2 in which the fillet height was no greater than 20%.

Example 4

(a) Sample Preparation

In Example 4, Samples 4-1 to 4-4 of the thermoelectric conversion module 10 were prepared using a skutterudite thermoelectric material. The composition of the P-type thermoelectric material was $CeFe_{2.5}Co_{1.5}Sb_{12}$, and the composition of the N-type thermoelectric material was $CeFeCo_3Sb_{12}$. The thermoelectric material was prepared by solidification molding a powder manufactured by pulverizing an ingot obtained by being melted, according to the SPS process.

The configuration other than the thermoelectric materials of Samples 4-1 to 4-4 of the thermoelectric conversion module 10 was the same as Samples 1-1 to 1-6 according to Example 1.

Table 13 shows the types of the bonding material (metal nano paste) for forming the bonding layer 14, the sulfur content in the bonding layer 14, and the phosphorus content in the bonding layer 14 in each of Samples 4-1 to 4-4.

TABLE 13

| Sample | Bonding material | Sulfur content | Phosphorus content |
|---|---|---|---|
| 4-1 | Silver nano paste | 83 ppm | 70 ppm |
| 4-2 | Copper nano paste | 65 ppm | 104 ppm |

TABLE 13-continued

| Sample | Bonding material | Sulfur content | Phosphorus content |
|---|---|---|---|
| 4-3 | Silver nano paste | 232 ppm | 157 ppm |
| 4-4 | Silver nano paste | 50 ppm | 227 ppm |

In Samples 4-1, 4-3, and 4-4, silver nano paste was employed as the bonding material for forming the bonding layer 14. In Sample 4-2, copper nano paste was employed as a boding material for forming the bonding layer 14.

In Samples 4-1 and 4-2, both the sulfur content and the phosphorus content in the bonding layer 14 were no greater than 200 ppm. In Sample 4-3, the sulfur content in the bonding layer 14 was greater than 200 ppm. In Sample 4-4, the phosphorus content in the bonding layer 14 was greater than 200 ppm.

(b) Thermal Cycling Test

Initially, the thermal cycling test was performed for each of Samples 4-1 to 4-4 in the same manner performed in Example 2.

Table 14 shows the results of measuring alternating current electric resistance in a state of maintaining the second substrate 13 at 100° C. at each specified number of cycles for each of Samples 4-1 to 4-4. The alternating current electric resistance at each specified number of cycles is shown as the change ratio (%) relative to the alternating current electric resistance prior to the thermal cycling test (0 cycles).

Table 15 shows the results of measuring the power generation capacity (W) in a state of maintaining the second substrate 13 at 550° C. at each specified number of cycles for each of Samples 4-1 to 4-4.

TABLE 14

| | Number of cycles | | | | | | |
|---|---|---|---|---|---|---|---|
| | 0 | 1,000 | 2,000 | 3,000 | 5,000 | 7,000 | 10,000 |
| Sample 4-1 | 0% | 0% | 0.1% | 0.1% | 0.2% | 0.2% | 0.2% |
| Sample 4-2 | 0% | 0% | 0.1% | 0.1% | 0.2% | 0.3% | 0.3% |
| Sample 4-3 | 0% | 0% | 0.1% | 0.1% | 0.2% | 0.3% | 0.3% |
| Sample 4-4 | 0% | 0% | 0.1% | 0.1% | 0.2% | 0.3% | 0.3% |

TABLE 15

| | Number of cycles | | | | | | |
|---|---|---|---|---|---|---|---|
| | 0 | 1,000 | 2,000 | 3,000 | 5,000 | 7,000 | 10,000 |
| Sample 4-1 | 24.3 W | 24.3 W | 24.3 W | 24.3 W | 24.3 W | 24.3 W | 24.3 W |
| Sample 4-2 | 24.3 W | 24.3 W | 24.3 W | 24.3 W | 24.3 W | 24.3 W | 24.3 W |
| Sample 4-3 | 23.2 W | 23.2 W | 23.2 W | 19.2 W | 18.7 W | 16.7 W | 15.8 W |
| Sample 4-4 | 23.2 W | 23.2 W | 23.2 W | 20.2 W | 18.5 W | 16.2 W | 15.4 W |

With reference to Table 14, in all of Samples 4-1 to 4-4, the change ratio of the alternating current electric resistance at 10,000 cycles was at most approximately 0.2% to 0.3%.

Furthermore, with reference to Table 15, the power generation capacity (W) did not change up to 10,000 cycles in Samples 4-1 and 4-2. On the other hand, in Samples 4-3 and 4-4, the power generation capacity started to fall at around 3,000 cycles and fell by at least 7 W at 10,000 cycles. Thus, it is found that higher long-term reliability can be acquired by setting both the sulfur and phosphorus contents to be no greater than 200 ppm.

Furthermore, with reference to Table 14 and Table 15, the difference in performance between Sample 4-1 employing the silver nano paste and Sample 4-2 employing the copper nano paste cannot be found (any significant difference in the decreasing ratio of the power generation capacity (W) depending on the number of cycles cannot be found). In view of this, it is found that the long-term reliability is not affected irrespective of which of the silver nano paste or the copper nano paste is employed.

(c) Conversion Efficiency η

Next, a plurality of the abovementioned Samples 4-1 and 4-2 in which the height h of the fillet F differed were prepared, and the conversion efficiency η was measured for each of Samples 4-1 and 4-2 in the same manner performed in Example 2.

Table 16 shows the fillet height and the measurement result of the conversion efficiency η for Samples 4-1 and 4-2. The fillet height in each of Samples 4-1 and 4-2 is shown as the ratio (%) of the height h of the fillet F to the height t of the thermoelectric element 11.

TABLE 16

| Sample | Fillet height | Conversion efficiency η |
|---|---|---|
| 4-1 | 15% | 6.1% |
| 4-1 | 22% | 5.8% |
| 4-1 | 30% | 5.5% |
| 4-1 | 35% | 5.3% |
| 4-2 | 12% | 6.1% |
| 4-2 | 22% | 5.7% |
| 4-2 | 29% | 5.4% |
| 4-2 | 33% | 5.3% |

With reference to Table 16, in all of Samples 4-1 and 4-2, it can be found that the conversion efficiency η tends to decrease as the fillet height is higher. In particular, the high conversion efficiency η of approximately around 6.1% can be attained for samples from Samples 4-1 and 4-2 in which the fillet height was no greater than 20%.

Example 5

(a) Sample Preparation

In Example 5, Samples 5-1 to 5-6 of the thermoelectric conversion module 10 were prepared using a tetrahedrite thermoelectric material. Since the composition of the N-type tetrahedrite thermoelectric material is unknown, the silicide thermoelectric material was used as a substitute for the N-type thermoelectric material. The composition of the P-type thermoelectric material was $Cu_{11.5}Zn_{0.5}Sb_4S_{13}$, and the composition of the N-type thermoelectric material was $Mg_2Si_{0.4}Sn_{0.6}$. The thermoelectric material was prepared by solidification molding a powder manufactured by pulverizing an ingot obtained by being melted, according to the SPS process.

The configuration other than the thermoelectric materials of Samples 5-1 to 5-6 of the thermoelectric conversion module 10 is the same as Samples 1-1 to 1-6 according to Example 1.

Table 17 shows the types of the bonding material (metal nano paste) for forming the bonding layer 14, the sulfur content in the bonding layer 14, and the phosphorus content in the bonding layer 14 in each of Samples 5-1 to 5-6.

TABLE 17

| Sample | Bonding material | Sulfur content | Phosphorus content |
|---|---|---|---|
| 5-1 | Silver nano paste | 111 ppm | 75 ppm |
| 5-2 | Copper nano paste | 120 ppm | 87 ppm |
| 5-3 | Silver nano paste | 211 ppm | 75 ppm |
| 5-4 | Silver nano paste | 114 ppm | 275 ppm |
| 5-5 | Copper nano paste | 208 ppm | 65 ppm |
| 5-6 | Copper nano paste | 87 ppm | 212 ppm |

In Samples 5-1, 5-3, and 5-4, silver nano paste was employed as the bonding material for forming the bonding layer 14. In Samples 5-2, 5-5, and 5-6, copper nano paste was employed as the boding material for forming the bonding layer 14.

In Samples 5-1 and 5-2, both the sulfur content and the phosphorus content in the bonding layer 14 were no greater than 200 ppm. In Samples 5-3 and 5-5, the sulfur content in the bonding layer 14 was greater than 200 ppm. In Samples 5-4 and 5-6, the phosphorus content in the bonding layer 14 was greater than 200 ppm.

(b) Thermal Cycling Test

Initially, the thermal cycling test was performed for each of Samples 5-1 to 5-6 in the same manner performed in Example 2.

Table 18 shows the results of measuring alternating current electric resistance in a state of maintaining the second substrate 13 at 100° C. at each specified number of cycles for each of Samples 5-1 to 5-6. The alternating current electric resistance at each specified number of cycles is shown as the change ratio (%) relative to the alternating current electric resistance prior to the thermal cycling test (0 cycles).

Table 19 shows the results of measuring the power generation capacity (W) in a state of maintaining the second substrate 13 at 550° C. at each specified number of cycles for each of Samples 5-1 to 5-6.

TABLE 18

| | Number of cycles | | | | | | |
|---|---|---|---|---|---|---|---|
| | 0 | 1,000 | 2,000 | 3,000 | 4,000 | 7,000 | 10,000 |
| Sample 5-1 | 0% | 0% | 0.1% | 0.1% | 0.3% | 0.8% | 0.9% |
| Sample 5-2 | 0% | 0% | 0.1% | 0.1% | 0.3% | 0.8% | 0.9% |
| Sample 5-3 | 0% | 0% | 0.1% | 0.1% | 0.3% | 0.8% | 0.9% |
| Sample 5-4 | 0% | 0% | 0.1% | 0.1% | 0.3% | 0.8% | 0.9% |
| Sample 5-5 | 0% | 0% | 0.1% | 0.1% | 0.2% | 0.3% | 0.3% |
| Sample 5-6 | 0% | 0% | 0.1% | 0.1% | 0.3% | 0.8% | 0.9% |

TABLE 19

| | Number of cycles | | | | | | |
|---|---|---|---|---|---|---|---|
| | 0 | 1,000 | 2,000 | 3,000 | 4,000 | 7,000 | 10,000 |
| Sample 5-1 | 18.1 W | 18.1 W | 18.1 W | 18.1 W | 18.1 W | 17.9 W | 17.9 W |
| Sample 5-2 | 18.4 W | 18.4 W | 18.4 W | 18.4 W | 18.4 W | 18.2 W | 18.2 W |
| Sample 5-3 | 18.1 W | 18.1 W | 18.1 W | 17.4 W | 15.3 W | 14.3 W | 12.2 W |

TABLE 19-continued

| | \multicolumn{7}{c}{Number of cycles} | | | | | | |
|---|---|---|---|---|---|---|---|
| | 0 | 1,000 | 2,000 | 3,000 | 4,000 | 7,000 | 10,000 |
| Sample 5-4 | 18.1 W | 18.1 W | 18.1 W | 16.5 W | 14.3 W | 12.2 W | 9.7 W |
| Sample 5-5 | 24.3 W | 24.3 W | 24.3 W | 22.2 W | 20.9 W | 19.7 W | 18.2 W |
| Sample 5-6 | 18.4 W | 18.4 W | 18.4 W | 16.7 W | 15.7 W | 13.3 W | 10.2 W |

With reference to Table 18, in all of Samples 5-1 to 5-6, the change ratio of the alternating current electric resistance at 10,000 cycles were at most approximately 0.3% to 0.9%.

Furthermore, with reference to Table 19, the power generation capacity (W) hardly changed up to 10,000 cycles in Samples 5-1 and 5-2. On the other hand, in Samples 5-3 to 5-6, the power generation capacity started to fall at around 3,000 cycles and fell by at least 5 W at 10,000 cycles. Thus, it is found that higher long-term reliability can be acquired by setting both the sulfur and phosphorus contents to be no greater than 200 ppm.

Furthermore, with reference to Table 18 and Table 19, the difference in performance between Samples 5-1, 5-3, and 5-4 employing the silver nano paste and Samples 5-2, 5-5, and 5-6 employing the copper nano paste cannot be found (any significant difference in the decreasing ratio of the power generation capacity (W) depending on the number of cycles cannot be found). In view of this, it is found that the long-term reliability is not affected irrespective of which of the silver nano paste or the copper nano paste is employed.

(c) Conversion Efficiency η

Next, a plurality of the abovementioned Samples 5-1 and 5-2 in which the height h of the fillet F differed were prepared, and the conversion efficiency η was measured for each of Samples 5-1 and 5-2 in the same manner performed in Example 2.

Table 20 shows the fillet height and the measurement result of the conversion efficiency η for Samples 5-1 and 5-2. The fillet height in each of Samples 5-1 and 5-2 is shown as the ratio (%) of the height h of the fillet F to the height t of the thermoelectric element 11.

TABLE 20

| Sample | Fillet height | Conversion efficiency η |
|---|---|---|
| 5-1 | 14% | 5.9% |
| 5-1 | 22% | 5.5% |
| 5-1 | 30% | 5.3% |
| 5-1 | 32% | 5.3% |
| 5-2 | 16% | 5.9% |
| 5-2 | 22% | 5.4% |
| 5-2 | 30% | 5.2% |
| 5-2 | 32% | 5.2% |

With reference to Table 20, in all of Samples 5-1 and 5-2, it can be found that the conversion efficiency η tends to decrease as the fillet height is higher. In particular, the high conversion efficiency η approximately around 5.9% can be attained for samples from Samples 5-1 and 5-2 in which the fillet height was no greater than 20%.

Others

Although the embodiments of the present invention are described as above, the present invention is not limited to the abovementioned embodiments, and thus various modifications may be made without departing from the spirit and scope of the present invention.

For example, although the thermoelectric conversion module with only a single layer of the thermoelectric element was described in the abovementioned embodiments, the present invention can be applied to a multi-layer thermoelectric conversion module in which layers of the thermoelectric element are configured in a multi-layer manner. Furthermore, although each of the substrates is integrally configured in the thermoelectric conversion module according to the abovementioned embodiments, each of the substrates may be divided as appropriate according to patterns of the metalized layer. Moreover, although the configuration of the thermoelectric element including the diffusion prevention layer between the chip and the bonding layer in the thermoelectric conversion module according to the abovementioned embodiments is described, the thermoelectric conversion module may not include the diffusion prevention layer necessarily.

EXPLANATIONS FOR REFERENCE NUMERAL 10 thermoelectric conversion module
101 assembly
11 thermoelectric element
111 chip
111a P-type chip
111b N-type chip
112 diffusion prevention layer
113 metalized layer
12 first substrate
121 base
122 metalized layer
13 second substrate
131 base
132 metalized layer
14 bonding layer
141 metal nano paste
16 lead wire
16a bonding portion
F fillet

What is claimed is:
1. A thermoelectric conversion module comprising:
a first substrate comprising a first metalized layer;
a second substrate comprising a second metalized layer which faces the first metalized layer;
a thermoelectric element comprising (i) a chip formed from a thermoelectric material and being arranged between the first metalized layer and the second metalized layer, (ii) a first diffusion prevention layer, and (iii) a third metalized layer; and a bonding layer including a fillet portion partially covering a side face of the thermoelectric element by directly contacting the side face of the thermoelectric element and being composed of a sintered body of a metallic material having an average crystal particle diameter of no greater than 20 µm, the bonding layer bonding the first metalized layer and the second metalized layer with the thermoelectric element, wherein the first diffusion prevention layer is arranged between the chip and the bonding layer, and the third metalized layer is arranged between the chip and the bonding layer, and wherein a height of the fillet portion of the bonding layer partially covering the side face of the thermoelectric element by directly contacting the side face of the thermoelectric element is both (i) no greater than 20% of a height of the thermoelectric element and (ii) greater than a total thickness of the first diffusion prevention layer and the third metalized layer.

2. The thermoelectric conversion module according to claim 1, wherein the thermoelectric material is a half-Heusler thermoelectric material, a silicide thermoelectric material, a skutterudite thermoelectric material, and a tetrahedrite thermoelectric material, or a combination thereof.

3. The thermoelectric conversion module according to claim 1, wherein both a phosphorus content and a sulfur content in the bonding layer are no greater than 200 ppm.

4. The thermoelectric conversion module according to claim 1, wherein the thermoelectric element further comprises:

a second diffusion prevention layer and a fourth metalized layer disposed on an opposite side of the chip as the first diffusion prevention layer and the third metalized layer, wherein the height of the fillet portion of the bonding layer partially covering the side face of the thermoelectric element is no greater than 20% of a combined height of the first diffusion prevention layer, the third metalized layer, the chip, the second diffusion prevention layer, and the fourth metalized layer.

5. The thermoelectric conversion module according to claim 4, wherein the fillet portion of the bonding layer covers a side face of the first diffusion prevention layer and a side face of the third metalized layer.

6. The thermoelectric conversion module according to claim 5, wherein a thickness of the first diffusion prevention layer is no less than 5 µm.

7. The thermoelectric conversion module according to claim 1, wherein the fillet portion of the bonding layer covers a side face of the first diffusion prevention layer.

8. The thermoelectric conversion module according to claim 1, wherein a thickness of the first diffusion prevention layer is no less than 5 µm.

* * * * *